(12) United States Patent
Zenteno

(10) Patent No.: US 6,522,450 B2
(45) Date of Patent: Feb. 18, 2003

(54) LOSS-LESS TUNABLE PER-CHANNEL DISPERSION COMPENSATOR

(75) Inventor: Luis A. Zenteno, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 34 days.

(21) Appl. No.: 09/841,899

(22) Filed: Apr. 25, 2001

(65) Prior Publication Data

US 2002/0159691 A1 Oct. 31, 2002

(51) Int. Cl.[7] .................................................. G02F 1/03
(52) U.S. Cl. ....................... 359/260; 359/245; 359/240
(58) Field of Search ................................ 359/260, 578, 359/577; 372/99, 92

(56) References Cited

U.S. PATENT DOCUMENTS

| | | | | |
|---|---|---|---|---|
| 5,023,947 A | * | 6/1991 | Cimini et al. ............... | 356/480 |
| 5,473,719 A | | 12/1995 | Stone .......................... | 385/123 |
| 5,636,046 A | | 6/1997 | Ishikawa et al. ............. | 359/161 |
| 5,861,970 A | | 1/1999 | Tatham et al. ............... | 359/161 |
| 5,867,293 A | | 2/1999 | Kotten ........................ | 359/161 |
| 5,877,879 A | * | 3/1999 | Naito .......................... | 359/133 |
| 5,969,865 A | | 10/1999 | Shirasaki .................... | 359/577 |
| 6,005,702 A | | 12/1999 | Suzuki et al. ............... | 359/183 |
| 6,088,147 A | | 7/2000 | Weber et al. ................ | 359/237 |
| 6,097,529 A | | 8/2000 | Lee et al. .................... | 359/279 |
| 6,115,156 A | | 9/2000 | Otani et al. ................. | 359/124 |
| 6,137,604 A | | 10/2000 | Bergano ..................... | 359/124 |

FOREIGN PATENT DOCUMENTS

| | | |
|---|---|---|
| EP | 0 997 751 A2 | 3/2000 |
| JP | Hei 61994-67228 | 3/1994 |
| WO | WO 99/63694 | 12/1999 |

OTHER PUBLICATIONS

J. of Lightwave Technology, vol. , No. 7, Jan. 1989, pp. 39–44, Luis Zenteno.
Optical Fiber Technology 6, 164–180 (2000), Lars Grüner–Nielsen et al.
PD7–1 Demonstration of virtually–imaged phased–array device for tunable dispersion Compensation in 16× 10Gb/s WDM transmission over 480km standard fiber, L.D. Garrett et al.

* cited by examiner

Primary Examiner—Thong Nguyen
Assistant Examiner—Denise S. Allen
(74) Attorney, Agent, or Firm—Juliana Agon

(57) ABSTRACT

An apparatus and method of chromatic dispersion includes the negative compensation per channel filter (130) coupled to an optical receiving path (100) for providing a lossless discontinuous per-channel dispersion compensation in the optical receiving path (100). The optical receiving path (100) includes an input port (131), at the input of the filter (130), for receiving an input optical pulse (120) having a packet of waves at corresponding frequencies transmitted and received by an optical fiber (115).

10 Claims, 7 Drawing Sheets

FIG. 9 GROUP DELAY WITH / WITHOUT SATURATING SIGNAL

LOSS-LESS TUNABLE PER-CHANNEL DISPERSION COMPENSATOR

BACKGROUND OF THE INVENTION

1. Field of the Invention

The present invention relates generally to optical communications, and particularly to group delay dispersion compensation for optical communications.

2. Technical Background

Wavelength division multiplexing (WDM) is commonly used to more efficiently utilize bandwidth for high-speed or high-bit-rate data transmission in an optical fiber network. In a WDM system, each high-speed data channel transmits the information contained within the channel at a pre-allocated wavelength on a single optical waveguide, such as an optical fiber. By sharing the transmission medium of the common waveguide, multiple high speed data signals can be multiplexed for transmitting data to a distant location. At the receiver end, channels of different wavelengths are separated or demultiplexed by narrow-band filters and then detected, optically monitored or otherwise used for further processing. As capacity needs increase, WDM systems multiplex higher and higher densities of wavelength channels to evolve into a dense WDM (DWDM) system by decreasing the channel spacings between channels. The International Telecommunications Union (ITU) has standardized a frequency grid for DWDM systems conformity. This ITU grid consists of 45 equally spaced apart frequency designations or channel spacing of 100 GHz which equates to a small free spectral range (FSR) of about 0.8 nm between adjacent channels in the wavelength range from 1533 to 1565 nm. As capacity is needed, commercial available systems may further evolve into higher number of channels more closely spaced.

To understand what the FSR is, a brief description of the optical signal is first given. The optical signal transmitted will typically be a series of light pulses of digital information with a "1" bit represented by the presence of light at a relatively high intensity or amplitude. Alternatively, a "0" bit corresponds to a substantial reduction in optical intensity or amplitude. Each optical pulse is a packet of waves where each wave in the packet is within a frequency bandwidth. Additionally, each wave in the packet is characterized by a plurality of different frequencies as well as a plurality of different amplitudes. An optical device (e.g. amplifier, repeater, filter, and fiber) has an amplitude response and a phase response. The amplitude response describes the attenuation of each frequency in the optical pulse after transmission through the optical device relative to their attenuation before transmission through the optical device.

The phase response determines the time delay for each frequency in the packet of waves. The period over which this phase or frequency response of the optical pulse repeats is called the free spectral range (FSR) of the optical device and can be written in frequency space in equation form as $FSR=1/\tau$ where $\tau$ is the propagation delay. For example, the FSR is the frequency spacing between two adjacent transmission or resonant peaks of a Fabry-Perot optical device.

In optical fiber communication systems chromatic dispersion is one of several key physical mechanisms that limit transmission capacity. Other limitations include propagation loss, polarization-mode dispersion and loss, and non-linear effects, such as cross-phase modulation (CPM), self-phase modulation (SPM) and four-wave mixing (FWM). As channel, spacing decreases as in DWDM systems, non-linear effects become more significant.

Chromatic or group velocity dispersion occurs when optical waves of different wavelengths (or spectral components of an optical signal pulse), propagate along an optical fiber at different group velocities to distort or broaden the pulse shape, limiting the rate at which information can be carried through the fiber. The linear dielectric response to the propagation of light in the dispersive medium or material of the optical device, typically silica from which optical fibers are typically made, for an optical communication systems, is dependent on the optical frequency (or wavelength). This material dispersion property of light propagation is one cause of chromatic or group delay dispersion, and is a consequence of the frequency dependence of the effective refractive index of the optical fiber. If the refractive index is a function of frequency, the effective refractive index will also be a function of wavelength. Hence, with positive group delay dispersion, the shorter wavelength light field experiences a higher refractive index and a lower group velocity, and therefore lags behind a longer wavelength light field.

Most optical devices used for transmitting optical pulses, such as single mode fibers, inherently apply a phase response to the optical pulse. This phase response changes the separation time between each frequency of the packet of waves, causing each frequency to be delayed for a different length of time. A given bit of a given (wavelength) channel propagates in the fiber at a speed determined by the group velocity. When each frequency of the packet of waves is delayed for a different length of time, the optical pulse output from such an optical device spreads, is broadened or otherwise distorted.

Relating to DWDM systems, another consequence of the wavelength dependence of the group delay is that it causes bits at different wavelengths to propagate at different speeds. As a result, bits from different channels initially overlapping in the time domain will eventually walk-off after sufficient propagation and acquire a relative group delay.

Hence, bits of a given channel will broaden because of group delay dispersion, and bits of adjacent channels will acquire a relative group delay. Broadening of the optical pulse is undesirable because, depending on the time between optical pulses, the leading and trailing edges of the broadened pulse can potentially overlap with the trailing edge of a previous optical pulse or the leading edge of a subsequent optical pulse, causing transmission or bit errors. Adjacent channels acquiring a group delay is desirable as this reduces the negative effects of non-linearities, such as FWM and SPM.

This broadening effect causes more bits to overlap at higher data rates in enhanced capacity systems. Once consecutive pulses have spread out so that they are no longer distinguishable, the information transmission limit of the optical communications system has been reached. This information transmission limit is expressed as a bandwidth distance product because it will be reached at a higher bit rate for a shorter optical communications link.

The dispersion of optical signals thus caused by dispersive devices can be reduced with a dispersion compensating element. Mathematically, the term dispersion refers to the first and higher order wavelength derivatives of the group delay experienced by the optical signal as it works its way through the device. The term group, delay refers to the slope of the phase response at each frequency in the packet of waves. The dispersion compensating element applies an additional dispersion to the optical signal which is the negative or opposite of the dispersion that was caused by the dispersive transmission fiber. This additional or second dispersion is added to the dispersion applied by the dispersive transmission fiber, so that the net system dispersion of the optical signal is about zero as seen in FIG. 8.

The two most widely used examples of fiber dispersion compensating elements are dispersion compensating (DC) fiber (or DCF) and dispersion compensating chirped fiber Bragg gratings (DCG). However, DCG's have limited bandwidth, making it necessary to concatenate a number of gratings to compensate for light including many wavelength channels, such as a wavelength division multiplexed light. Having multiple gratings, the DCG's are thus expensive to integrate into optical communication systems. Many chirped fiber gratings typically only compensate for quadratic dispersion, further limiting their utility to systems with quadratic dispersion.

Dispersion compensating fibers (DCF) are lossy. Lossy fibers are undesirable because they potentially reduce the optical power of signals transmitted along their length. DCF suffers not only from such high loss, but it also introduces extra power penalties due to optical non-linearities associated with its small effective area.

As mentioned already, transmission fiber itself introduces dispersion in an optical transmission system. Single mode fiber (SMF) fiber has its zero dispersion wavelength near 1.3 micron and its minimum loss near 1.55 micron. Thus transmission systems based on SMF fibers use a dispersion compensating element, possibly a DCF to compensate for dispersion.

To reduce the dispersion compensation requirements of the entire system, some WDM systems use dispersion shifted fiber (DSF) as the transmission fiber. Dispersion shifted fiber (DSF) can provide a transmission path with a close to zero dispersion at one wavelength near 1.55 micron, however, it suffers from certain nonlinearities, such as four-wave mixing (FWM), which affects signal integrity. Four-wave mixing is a nonlinear effect that causes a plurality of waves propagating down a fiber at predetermined channel spacings to create a new wave at a particular frequency. This newly created wave causes crosstalk when it interferes with other channels-within the ITU grid or signal channel plan. The magnitude and effects of FWM for a fixed amount of power per channel is inversely proportional to the frequency separation or spacing of the channels, the local chromatic dispersion of the dispersive transmission fiber, and the number of channels present.

At bit-rates in the high speed, high data 10–40 Gbits/s range, near the information transmission limit of high capacity DWDM systems, non-linearities become more significant a problem with conventional broadband dispersion compensating elements such as DC fiber. Thus, as bit rates increase, power per channel increases, and channel spacing decreases, to accommodate more system capacity, there is an increased need to compensate for chromatic dispersion without exhacerbating the undesired impairments caused by non-linear effects in the system.

SUMMARY OF THE INVENTION

One aspect of the present invention is the coupling of a negative compensation per channel filter to an optical receiving path for providing a discontinuous per-channel dispersion compensation in the optical receiving path without incurring or causing other types of system degradation such as loss. The optical receiving path includes an input port, at the input of the filter, for receiving an input optical pulse having a packet of waves at corresponding frequencies transmitted and received by an optical fiber.

In another aspect, the present invention includes a method for group delay dispersion compensation that exactly reduces to zero the total system group-delay-dispersion only over each channel bandwidth; in effect, enough system group-delay-dispersion is left between channels in order to avoid non-linearity-induced transmission impairments such as FWM. The steps include monitoring the individual group delay dispersion of an optical fiber transmission system at the center frequency of each ITU grid channel bandwidth. By only compensating for the individual group delay dispersion of the optical fiber transmission system at the center frequency of each ITU grid channel, a function results which does not compensate uniformly for group delay dispersion across the system bandwidth.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE PREFERRED EMBODIMENTS

The present invention teaches a simple and cost effective optical device tailored to provide lossless and tunable per-channel group delay dispersion compensation without compensating for the relative group delay between channels to properly manage first and second order dispersion in communication systems transmitting a plurality of optical channels.

Figure 7:
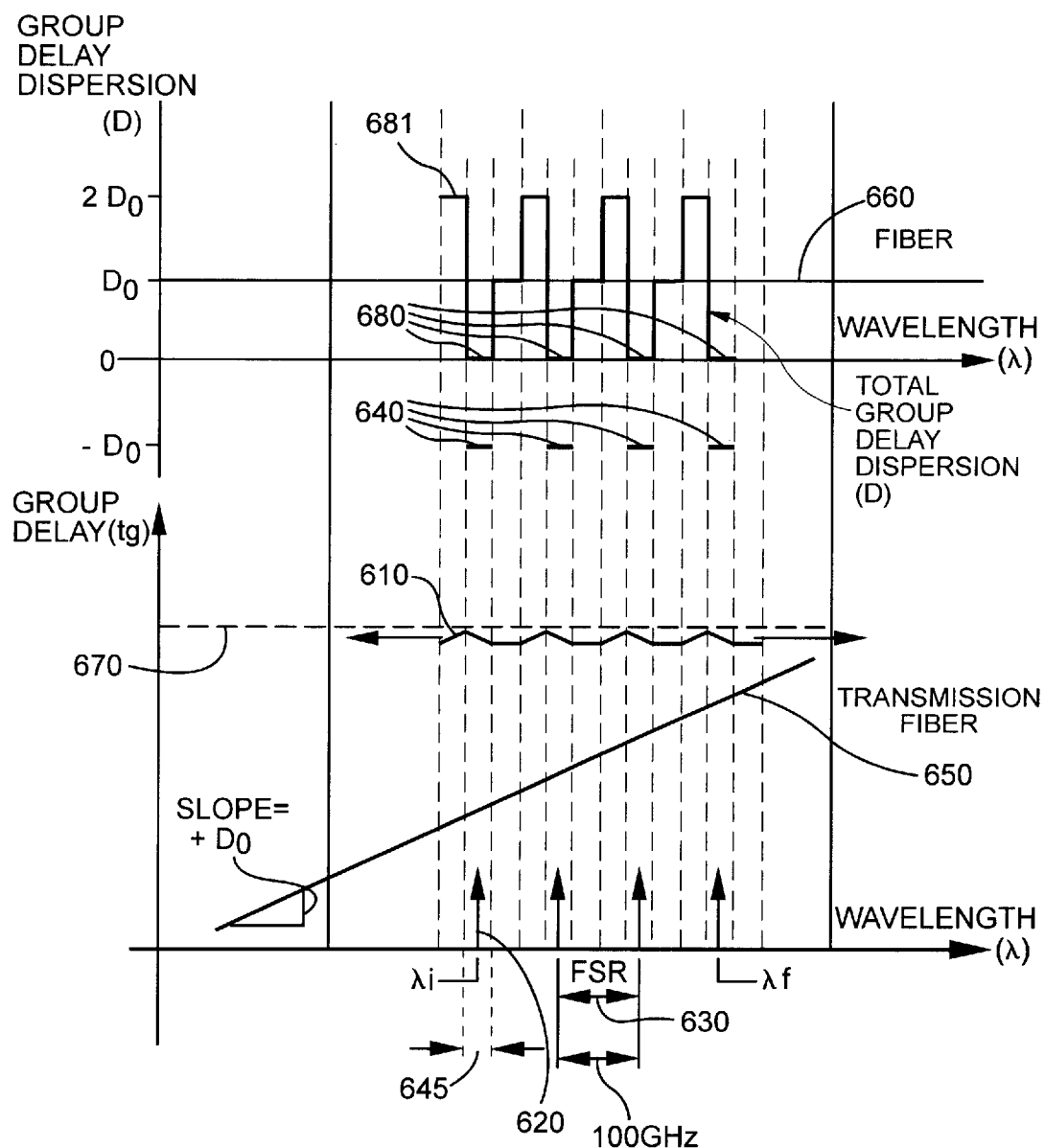
FIG. 7 is a chart showing the frequency dependent time delay tg and the dispersion applied by the feedback path of the negative per channel filter 130 of FIG. 1 to the packet of frequencies contained in the optical pulse, in accordance with the teachings of the present invention.
Figure 8:
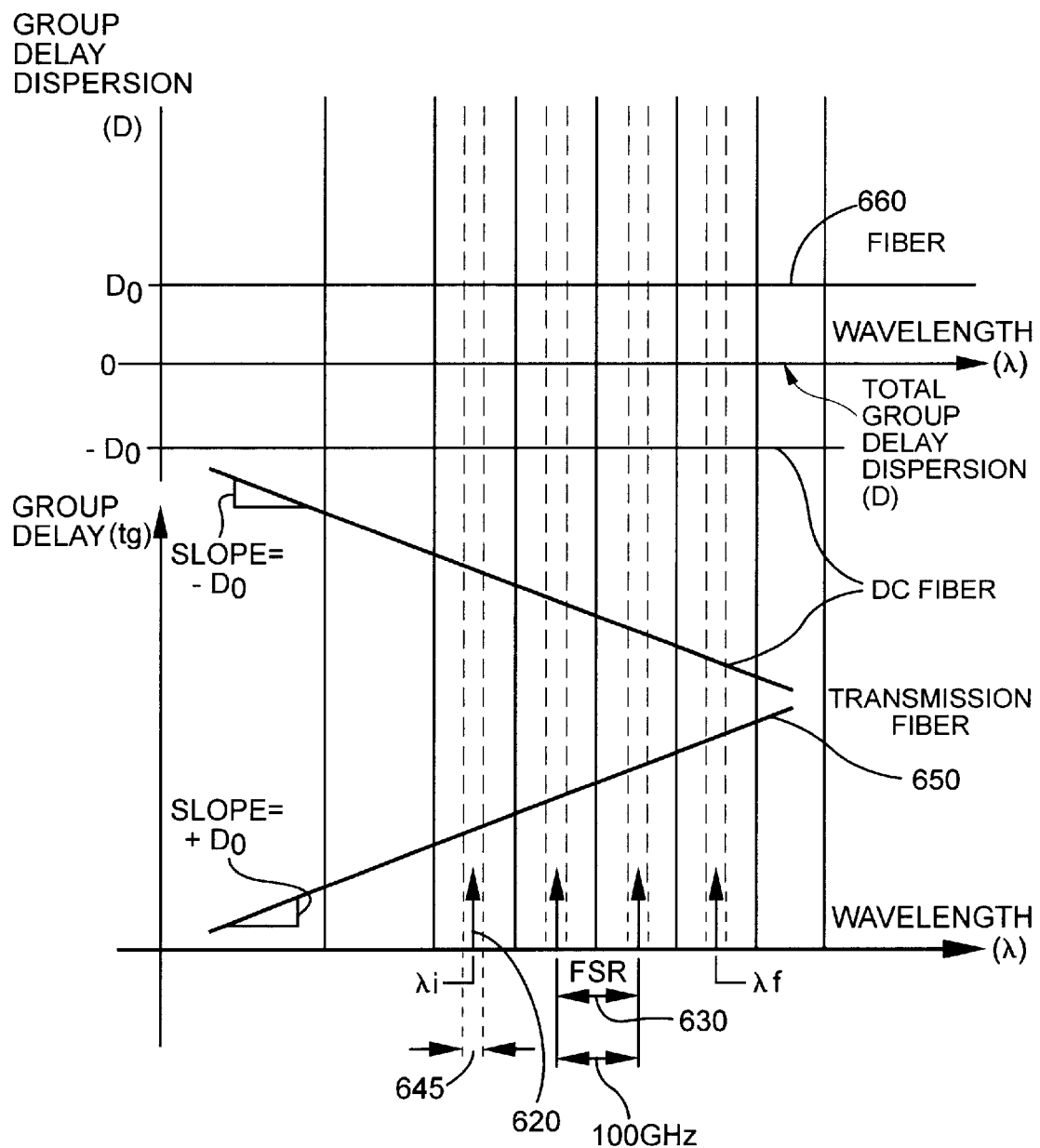
FIG. 8 is a chart showing the frequency dependent time delay tg and the dispersion applied by the feedback path of a dispersion compensating fiber to the packet of frequencies contained in the optical pulse as a reference to show the continuous zero dispersion through out the system.

To decrease the detrimental effects of non-linearities, the present invention teaches the importance of not compensating for the relative group delay between channels, as in FIG. 8, as this will enhance the penalties associated with non-linearities. Specifically, the non-linear interaction between two bits is only significant while the bits overlap, and becomes negligible when the faster bit has completely walked through the slower one. Correcting for relative group delay between channels across the system bandwidth, as in FIG. 8, increases interchannel bit overlap. Instead, as seen in FIG. 7, what should be compensated for is the group delay dispersion over each channel bandwidth only which causes an individual bit to broaden upon propagation.

One way to compensate for group delay dispersion but not relative group delay, is to compensate on a per channel basis, that is to say, to compensate "discontinuously" and independently over each channel bandwidth. By "discontinuosuly" is meant that the group-delay-dispersion of the compensating device exactly cancels the group-delay-dispersion of the transmission system only over each channel bandwidth. This feature prevents correction of relative group delay between adjacent channels. Independent compensation is meant by the choice of compensating for all of the channels with one compensating element or splitting the channels into sub-bands for compensation by various compensating elements. For example, a subset or sub-band of channels would be covered by one compensating element while another subset of channels is compensated by another compensating element.

Per-channel tunable dispersion compensation also allows the system to compensate for variable amounts of dispersion from span to span, and to compensate for dispersion variations caused by changing environmental conditions in a given span. At 40 Gb/s, such environmental variations may approach the dispersion tolerance of the system ($\approx$50 ps/nm).

However, in addition to the disadvantages already described, neither the DCF or DCG types of dispersion compensating elements allow for practical tunable per-channel compensation. DCF does not allow for variable dispersion compensation, making it cumbersome to compensate on a per-span basis between Erbium Doped Fiber Amplifers (EDFA) repeaters, and impractical to compensate for environmental changes of fiber dispersion.

Therefore, the present invention teaches a method and apparatus for providing tunable loss-less group delay dispersion compensation on a per-channel basis.

Figure 1:
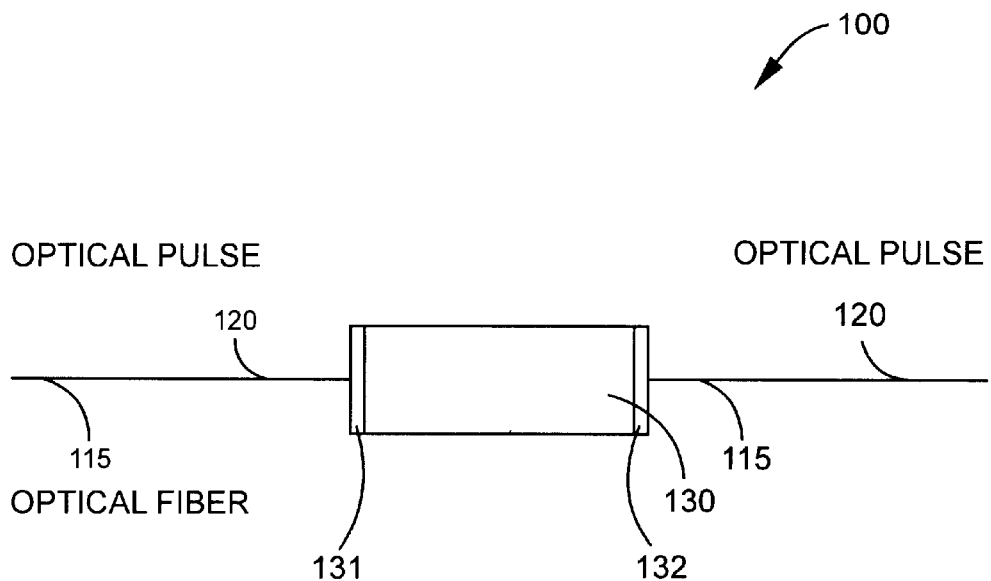
FIG. 1 is a schematic of an optical communication system including a negative compensation per channel filter, in accordance with the teachings of the present invention.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of the negative per channel filter of the present invention is shown in FIG. 1, and is designated generally throughout by reference numeral 130. As used here, the term negative does not imply a minus sign but rather the more general meaning of an opposite entity. For example, if the system dispersion is negative, then the effect of the negative per channel filter is positive so that the total dispersion or net effect is now close to zero at the channel bandwidths.

Referring to FIG. 1 and in accordance with the invention, the present invention for an apparatus and method of chromatic dispersion includes the negative compensation per channel filter 130 coupled to an optical receiving path 100 for providing a discontinuous per-channel dispersion compensation in the optical receiving path 100. The optical receiving path 100 includes an input port 131, at the input of the filter 130, for receiving an input optical pulse 120 having a packet of waves at Corresponding frequencies transmitted and received by an optical fiber 115 related to a plurality of DWDM channels. Although the path 100 is represented as a receiving path, the receiving description is only illustrative for a normal case. In general, to minimize costs, the compensating element is preferably inserted at the end of the path (normally at the receiving end) to compensate for all of the dispersion of the system, instead of being inserted at the beginning of the path at the transmitter end. However, the invention is not so limited and the filter 130 can be inserted either end, even in a transmission path.

Under the specifications of the International Telecommunications Union, each frequency of the input optical pulse has an amplitude and a channel bandwidth where the packet of waves has a plurality of frequencies and spacing between the plurality of frequencies conforming to the International Telecommunications Union grid (ITU grid). An output port 132, at the output of the filter 130, couples the optical pulse 120 exiting from the filter 130 onto the fiber 115.

The advantages of the negative per channel filter 130 is that it discontinuously compensates for the individual group delay dispersion of the optical fiber 115 at the center ITU grid frequency of each ITU grid channel bandwidth but not for the relative group delay dispersion between the channels so that the inter-channel impairments caused by non-linearities are not enhanced. The negative per channel filter 130, disposed between the input port 131 and the output port 132, applies a desired frequency-dependent time delay to each frequency of each wave in the packet of waves contained in the optical pulse 120 entering the input port 131 such that the total group delay dispersion of pulses transmitted through the output port 132 approximates a constant value, over the channel bandwidth, for the net total system group-delay dispersion experienced by the optical pulse defined by the first derivative-of the group delay, to reduce to about zero. Moreover, the negative per channel filter 130 has a uniform amplitude transfer function to substantially preserve the amplitude of each frequency of the optical pulse transmitted to the output port.

As embodied herein, and depicted in FIG. 1, the negative per channel filter 130 is preferably, a Fabry-Perot (FP) laser amplifier or a FP semiconductor optical amplifier (SOA). Operated in a possible transmission mode, the SOA can have an input facet having a reflectivity of about 35% as the input port 131 and an output facet having a reflectivity of about 35% as the output port 132, for example.

Figure 2:
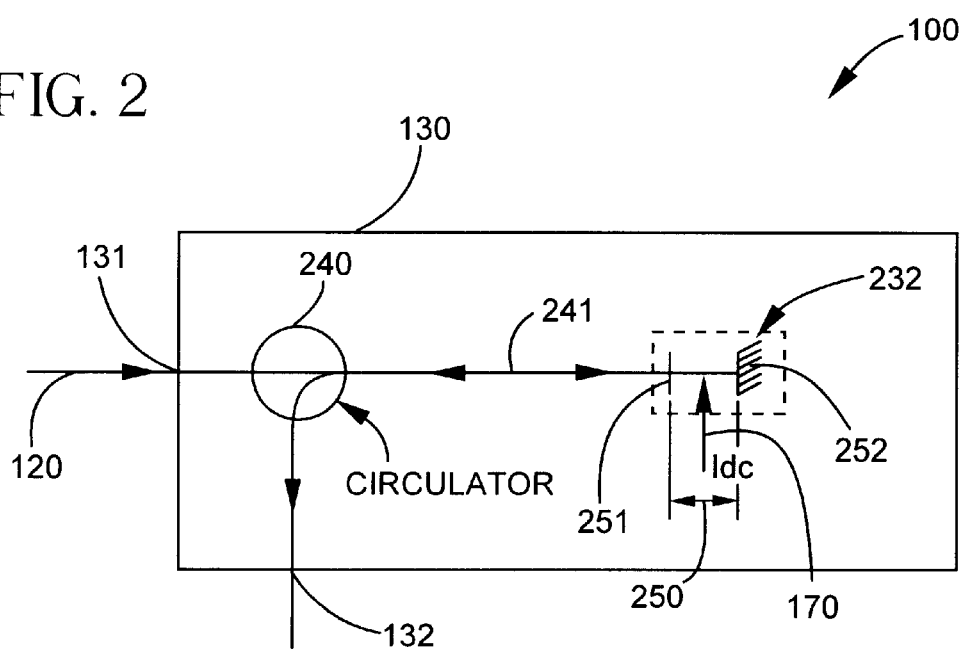
FIG. 2 is a schematic of an embodiment of the negative per channel filter 130 of FIG. 1 as a semiconductor optical amplifier (SOA), in accordance with the teachings of the present invention.

In an alternate embodiment of the invention, as embodied herein and as shown in FIG. 2, the negative per channel filter 130 is a dispersion compensating module (DCM) having a FP amplifier or semiconductor optical amplifier (SOA) 232 operated in reflection mode. This is the so-called Gires-Tournois interferometer configuration. In this configuration, it is necessary to include a circulator 240 as a part of the dispersion compensating module (DCM). The Fabry-Perot semiconductor optical amplifier (SOA) 232 is disposed in a feedback path 241 between the input port 131 and the output port 132 for providing a Fabry-Perot cavity 250 as defined by a first and second reflector 251 and 252, respectively. The Fabry-Perot cavity 250 is tuned to have a phase transfer function for providing a periodic frequency response exhibiting a spectral periodicity FSR matched to the ITU grid.

When the optical pulse 120 enters the negative per channel filter 130, a portion of the optical pulse is provided to the feedback path 241. The portion of the optical pulse provided to the feedback path 241, circulates repeatedly within the FP cavity 250. However, at each pass of the optical pulse in the feedback path 241, some portion of the reflected pulse is provided through the circulator 240 to the output port 132. This provision of some portion of the optical pulse circulating in the feedback path 241 through the circulator 240 to the output port 132 incrementally reduces the portion left.

Figure 3:
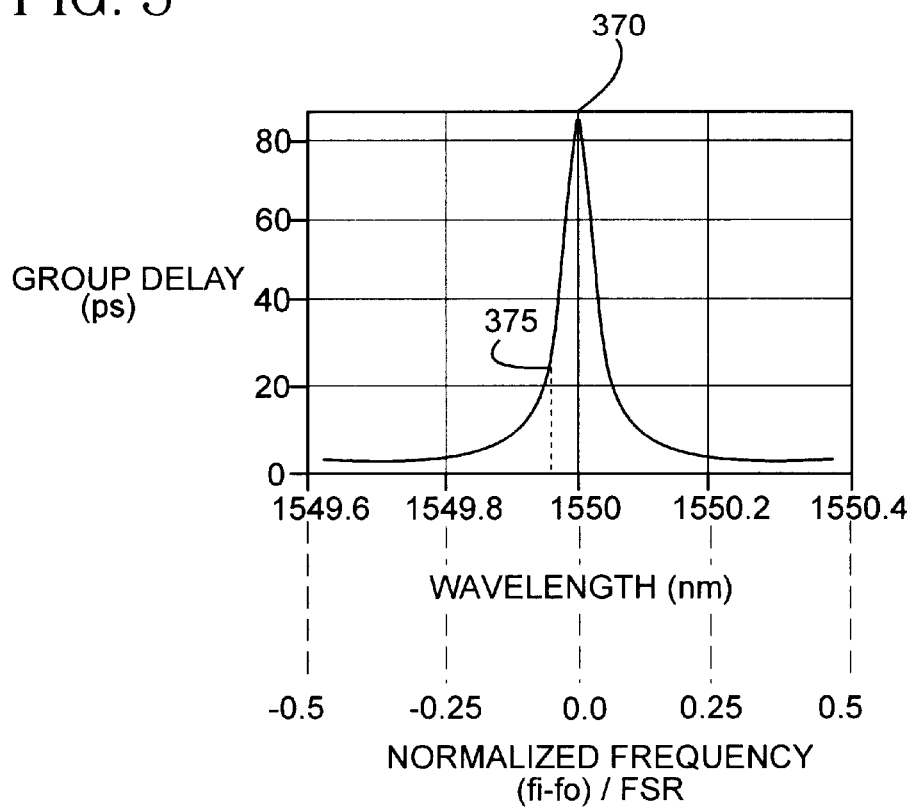
FIG. 3 is a chart showing the frequency dependent time delay applied by the feedback path of the negative compensation per channel filter 130 of FIG. 1 to the packet of frequencies contained in the optical pulse, in accordance with the teachings of the present invention.
Figure 9:
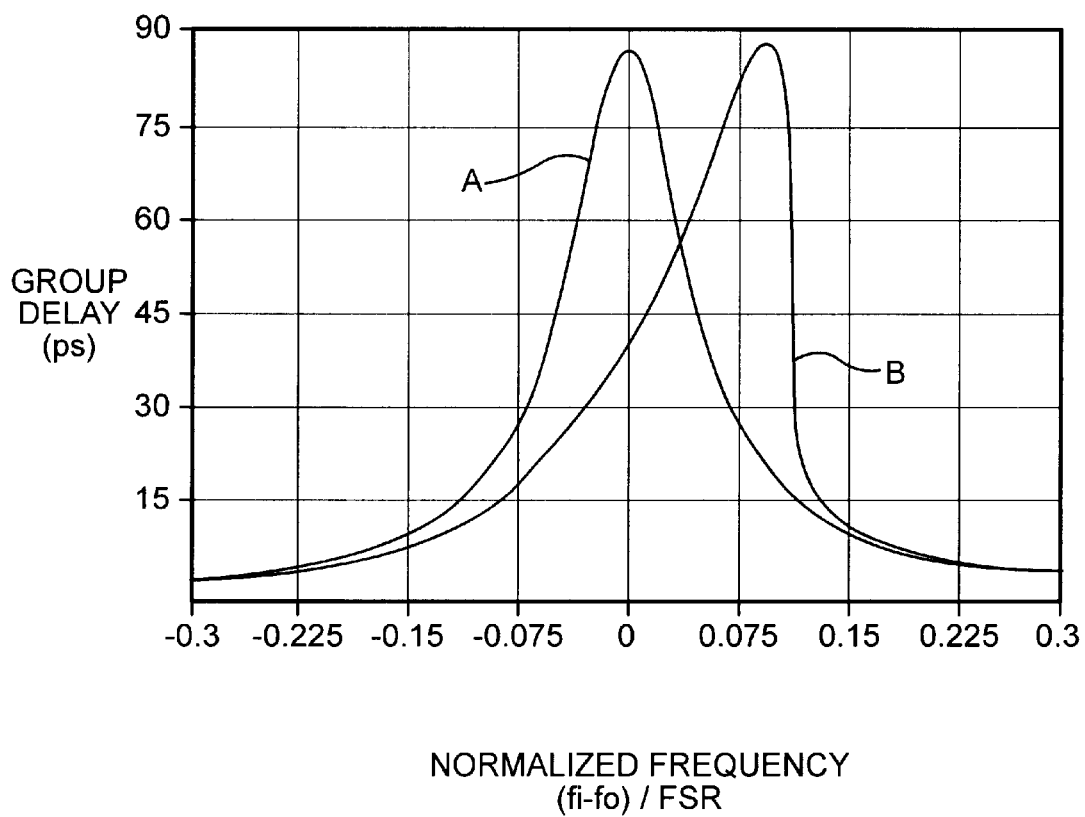
FIG. 9 is a chart showing the group delay with and without an out-of-band saturation signal, in accordance with the teachings of the present invention.

Referring to FIG. 3, the group delay of the negative per channel-filter 130 of FIG. 2 is graphed for the case of negligible SOA gain saturation. FIG. 9 shows this same case of negligible SOA gain saturation as curve A with the group delay referenced. As referenced to curve A of FIG. 9 as a comparison, curve B show how the resonance wavelength shifts and the shape of the tg vs ω function changes with the addition of an out-of-band saturating signal power 121 of FIG. 11, as seen in the resonance wavelength of the delay plots in FIG. 9.

Referring back to FIG. 3 and curve A in FIG. 9, this also represents the group delay plotted as a function of the normalized frequency $(f_1-f_0)/FSR$. Frequencies in the DWDM packet of frequencies of the optical pulse that fit an interger number or a multiple of the wavelengths appearing within the cavity are termed resonant frequencies and have a normalized frequency equal to zero, denoted as 370. The group delays correspond to the resonant frequencies 370. Frequencies that do not fit a multiple of wavelengths of the cavity are termed off-resonant frequencies. For example, in the linear region of this SOA, for powers well below the saturation power at resonant frequencies 370 the group delay is about 85 ps, while off-resonant frequencies located at a point 375, with a normalized frequency of about −0.05 have a group delay of about 23 ps. After the frequency dependent time delays are applied to each frequency of the optical pulse, the optical pulse exits the negative per channel filter 130 through the output port 132.

The group delay causing the dispersion of the SOA 232 of FIG. 2 depends on the facet reflectivities $R_1$, $R_2$, coupling losses, optical length (L), single-pass gain $G_s$, input optical power and other parameters of the SOA 232. Taking one example, FIG. 3 also shows the group delay of the SOA 232 in the reflection mode of FIG. 2, with an FSR=0.8 nm centered at 1550 nm, corresponding to the ITU channel spacing of 100 GHz in frequency units. Another advantage of having the FSR of the SOA 232 to be matched to the ITU grid spacing of 100 GHz is that such a wide channel spacing ensures that the SOA is not affected by the non-linear effects of four-wave mixing (FWM) which causes inter-channel crosstalk in the SOA. Preferably, the SOA is also operated at signal output powers well below its saturation power to avoid the other type of non-linear effects, cross-saturation, that induce crosstalk in an SOA. With the SOA 232 designed to have $R_1=0.625$, $R_2G_s^2=1$, chip length (L)=390 μm and a refractive index (n) of 3.84, the device has a peak group delay of about 85 ps.

Figure 10:
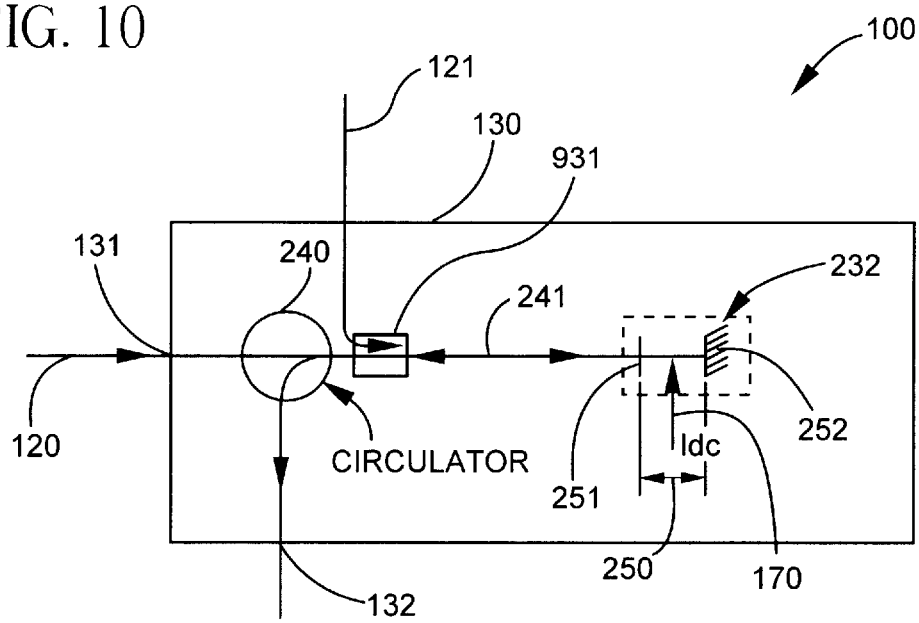
FIG. 10 is a schematic of an embodiment of the negative per channel filter 130 of FIG. 2 as a semiconductor optical amplifier (SOA), coupled to a WDM coupler, in accordance with the teachings of the present invention.
Figure 11:
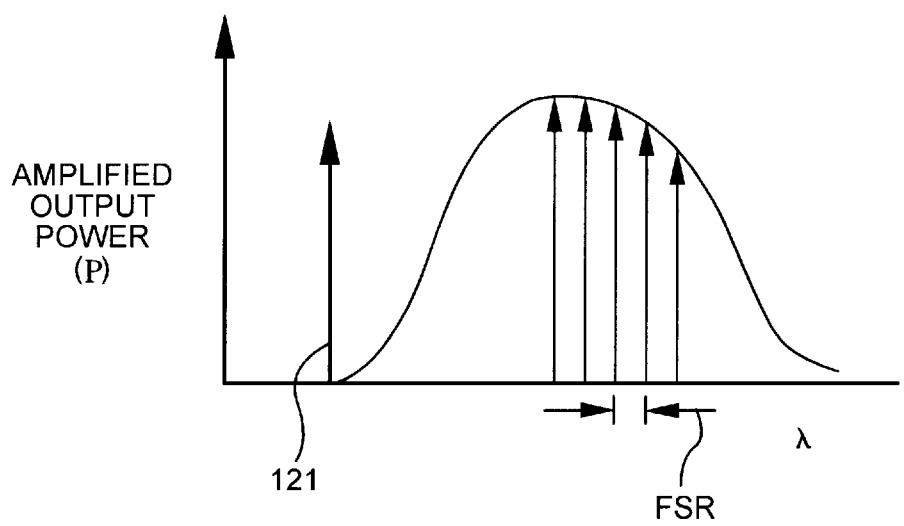
FIG. 11 is a chart showing the power versus wavelength relationship of the DWDM band and the out-of-band saturation signal 121 of FIG. 10, in accordance with the teachings of the present invention.

Alternatively, when the SOA is saturated with an out-of-band saturation signal 121, as seen in FIG. 10, the symmetry of the group delay is changed. The amplified output power versus wavelength curve of FIG. 11 shows the wavelength location of all of the amplified DWDM optical channels, in-band, and the out-of-band saturation signal 121, away from the DWDM band of optical channels. To vary the group delay symmetry, a dispersion-compensating amplifier as shown in FIG. 2 is used with the addition of a WDM coupler 931 is seen in FIG. 10 for receiving the pulse 120 containing a plurality of DWDM channels at the input port 131 and for coupling the out-of-band saturating signal 121. The WDM coupler 931 is preferably placed after the circulator 240 to produce a group delay shape as shown in curve B of FIG. 9 where the location and/or the symmetry of the resonance can be changed due to the presence of the out-of-band signal. In this saturated condition, the power of the saturating out-of-band signal can be used to "tune" the SOA through a combination of two effects: a shift of the resonace wavelength and a change in the shape (and thus the slope) of the group delay. This tuning may be combined with current adjustment to achieve the desired characterisitics.

Figure 4:
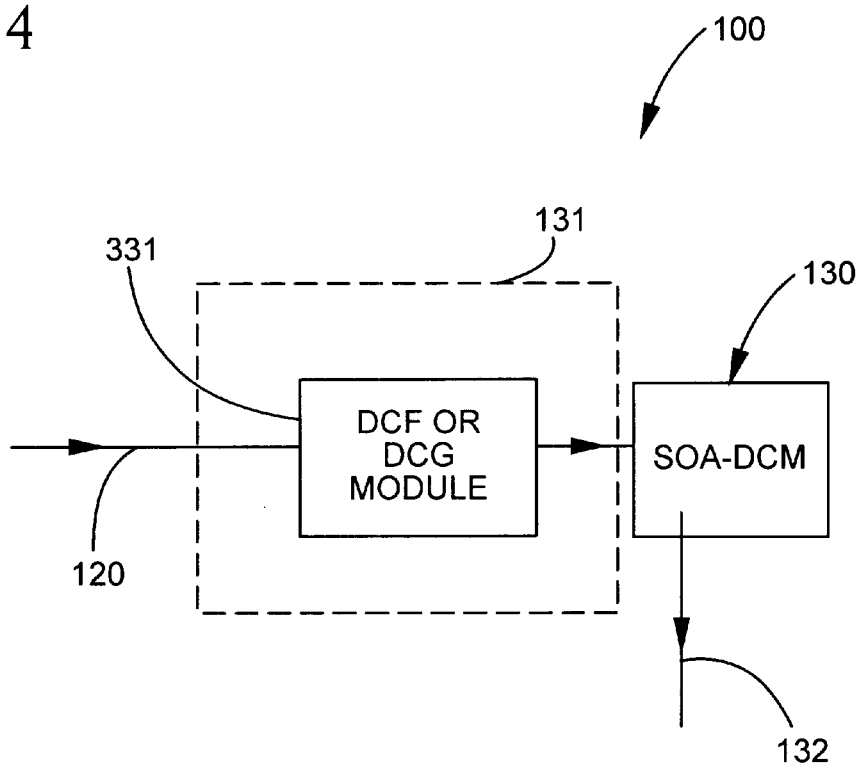
FIG. 4 is a schematic of the optical communication system of FIG. 1 including the negative compensation per channel filter 130 for dispersion trimming of another dispersion compensating element, in accordance with the teachings of the present invention.

Using the same operating principles, as taught by the present invention, other implementations of the negative compensation per channel filter or all-pass optical filter for group delay compensation are possible. Referring to FIG. 4, the input port 131 of FIG. 2 includes a first dispersion compensating element 331, such as a conventional dispersion compensating fiber (DCF) or dispersion compensating chirped fiber gratings (DCG) module, if extra dispersion compensation is needed. Especially at high bit-rates, such as 40 Gbits/s, it is desirable to have finely tunable dispersion trimming. In accordance with the teachings of the present invention, one SOA or two cascaded SOA's 232 of FIG. 2 can be arranged in tandem, configured in the reflection mode as the negative per channel filter 130 for dispersion trimming. In this case, the preferred embodiment of a dispersion compensating element or module (DCM) consists of a DCF or a DCG to provide most of the required dispersion compensation plus an SOA 232 of FIG. 2 as described here for dispersion trimming to provide the extra dispersion compensation as needed. The dispersion trimming can be done using a single SOA per channel independently or a single-SOA for a number of channels.

Figure 5:
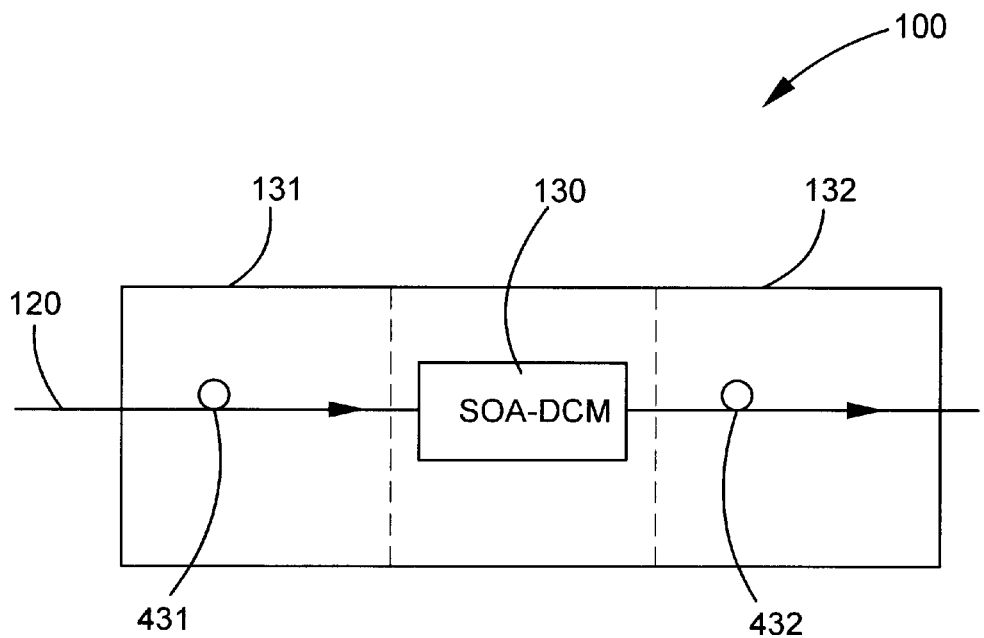
FIG. 5 is a schematic of the optical communication system of FIG. 1 including two amplifiers surrounding the negative per channel filter 130, in accordance with the teachings of the present invention.

Referring to FIG. 5, the input port 131 of FIG. 2 includes a first Erbium (Er) doped fiber amplifier 431 and similarly, the output port 432 includes a second Erbium doped fiber amplifier 432. As in FIG. 4, if extra dispersion compensation is needed, the first dispersion compensating element 331 could be inserted between the first amplifier 431 and the negative per channel filter 130. If implemented as an SOA, the negative per channel filter 130 is expected to have a high noise figure NF as a stand-alone device. To overcome this high noise figure, the SOA in reflection mode is placed between the two Er coils in their gain modules (EDFAs) 431 and 432. The first coil 431 acts as a high gain stage and the second coil 432 acts as the power stage. With two stages of amplification, the overall NF of the receiving path 100 is now acceptable.

Figure 6:
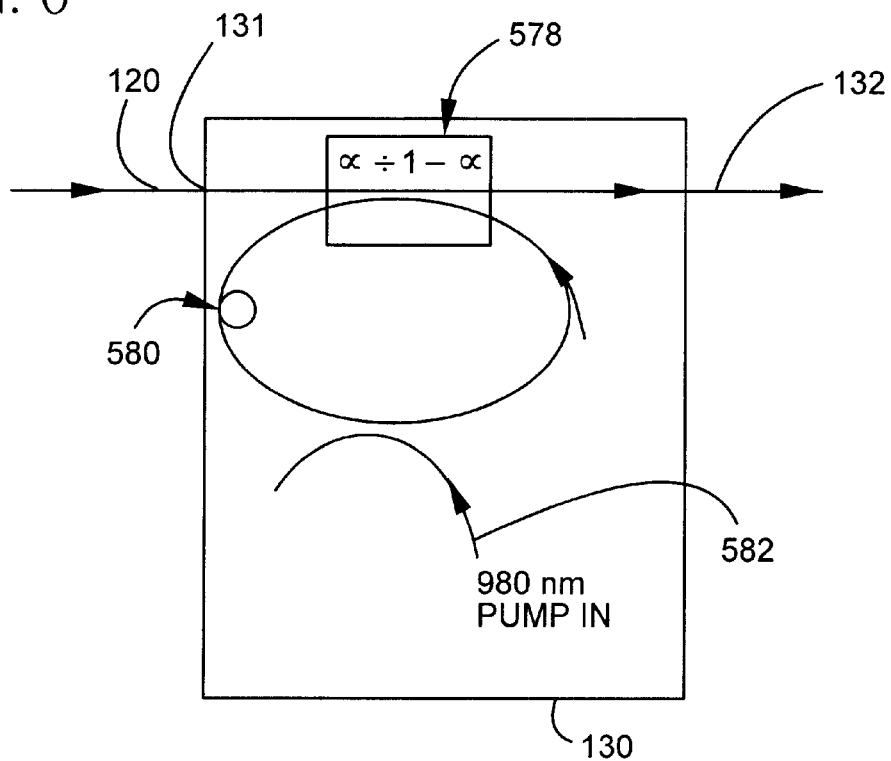
FIG. 6 is a schematic of an alternate embodiment of the negative per channel filter 130 of FIG. 1 as a coupled and amplified ring structure, in accordance with the teachings of the present invention.

In another alternative embodiment of the invention, as embodied herein and as shown in FIG. 6, the negative per channel filter 130 of FIG. 1 is implemented as a ring resonator structure. The ring resonator structure includes at least one ring resonator 580 which is preferably a closed loop made of Erbium (Er) doped polarization maintaining (PM) fiber, pumped referably by a 980 nm laser source 582, providing gain to the ring resonator structure. The ring resonator 580 is coupled to a polarization maintaining coupler 578. The coupling coefficient a of the coupler 578 controls the finesse of the ring cavity and hence can be designed to provide the necessary slopes of the frequencies resonating in the ring cavity. When the finesse is high, the response roll-off or slope becomes steeper to increase the channel spacing. As a matter of design choice, the coupling ratio determines the portions of the optical pulse 120 that are coupled into the feedback path of the ring 580 and the portions that are coupled directly away through the output port 132 via the coupler 578.

This embodiment thus provides an all fiber ring Fabry-Perot cavity with gain. The principle of operation is the same as described with the SOA implementations, but the gain in the ring is now provided by the Er-doped polarisation-maintaining fiber 580 pumped by the laser source 582. The ring has a predetermined path length. In order to match the FSR of this ring to the ITU grid, in accordance with the teachings of the present invention, the polarization-maintaining fiber 580 preferably is selected for high birefringence and the coupler 578 is also preferably made from a polarisation-maintaining fiber. The optical-path-difference in the ring is then given by the fiber birefringence. The two different path lengths in the ring 580 and the coupler 578 through the birefrigent material provides a phase difference and consequently a phase delay altenating in a wavelength channel and between the next adjacent wavelength channel in a periodic spectral response FSR of the ring resonator. The free spectral range is given by FSR≈c/Δn 2πR, where R is the ring radius, and Δn is the birefringence of the fiber ring. The birefrigent material would thus provide two different effective indices to vary the optical path length through the ring. Matching to the ITU grid can be accomplished by rotating ninety degrees with respect to each other the birefringence axes of two sections of polarisation maintaining fiber, and by choosing the lengths of these two sections of fiber accordingly.

Referring to FIG. 7, the operation of the negative per channel filter 130 of FIG. 1 is represented with the use of at least one Fabry-Perot semiconductor optical amplifier (SOA) configured to provide a Fabry-Perot cavity. The Fabry-Perot cavity is tuned to have a phase transfer function 610 or group delay tg for providing a periodic frequency response exhibiting a spectral periodicity or free spectral range (FSR) matched to a multiple of the ITU grid in the plurality of freqencies (or wavelengths) 620 and spacing 630. As seen in FIG. 7, the multiple for the ITU grid spacing is one to use as a simple example where all the channels (forty normally) would be compensated by the same SOA having the ITU grid spacing of 0.8 nm. However, if the multiple were two, a first set of twenty alternating channels would be compensated by one SOA having a grid spacing of 1.6 nm and another twenty alternating channels interleaved with the first set of channels would be compensated by the second SOA also having the same grid spacing of 1.6 nm.

With the simple multiple of one, the Fabry-Perot SOA is tuned to apply a desired frequency-dependent time delay to each frequency of each wave in the packet of waves contained in the optical pulse such that the group delay of pulses transmitted approximates a constant slope or derivative 640, over the channel bandwidth 645. Because dispersion of the optical pulse is defined by the first and higher order derivatives of the group delay, when the first derivative 660 of the fiber group delay response 650 and the derivative 640 of the SOA's group delay response 610 are added together, at each of the channel bandwidths, the total dispersion 680 is now designed to reduce to about zero at each of the channel bandwidths. As an additional advantage, because the semiconductor optical amplifier has a uniform amplitude transfer function 670, this form of the negative per channel filter substantially preserves the amplitude of each frequency of the optical pulse transmitted into it.

Hence, a method for lossless group delay dispersion compensation is taught. The steps include monitoring the group delay dispersion of an optical fiber transmission system at the center ITU grid frequency of at least one ITU grid channel as graphed in the fiber group delay curve 650. By only compensating for the individual group delay dispersion of the optical fiber transmission system at the center ITU grid frequency of at least one ITU grid channel, a discontinuous step function 681 results.

The discontinuous compensating step is accomplished, as an example, by tuning the semiconductor optical amplifier (SOA) such that at least one characteristic of the Fabry-Perot resonances compensate for at least one of the individual group delay of the optical fiber transmission system at the center ITU grid frequency of each ITU grid channel bandwidth.

For example and as seen in FIG. 2 and FIG. 7, the step of tuning includes increasing the amplitude 670 from a lower amplitude level of the Fabry-Perot resonances of FIG. 7 by increasing a direct current 170 into the semiconductor optical amplifier 232 of FIG. 2 to provide the appropriate gain and/or providing the appropriate slope for the roll-of (640) of the resonance starting from the top of the maximum amplitude 670. For example, a resonance having a higher amplitude might also have a steeper slope. However, a resonance having a lower amplitude would have a less steep slope. It is to be appreciated that this direct current tuning of the amplitude of the SOA can be done before or after the SOA is already in the optical path 100.

Alternatively or additionally, the step of tuning could also include slightly shifting the resonance frequencies (620) of the Fabry-Perot resonances left or right on the frequency or wavelength scale by varying a cavity length 250 of the semiconductor optical amplifier 232 of FIG. 2 to pick the rising slope or falling slope of the resonances in order to cause the slope of the resonances to be positive or negative for compensating for the opposite dispersion of the fiber when aligned within the channel bandwidths 645.

Because the resonances are linked to each other by the structure of the SOA and separated by the FSR 630, the resonances 620 may not be ideally tuned individually for the fiber dispersion perfectly within each channel bandwidth. However, the tuning step strives for a discontinuous dispersion compensating function 681 that provides for the best compensation possible within the channel bandwidths 645. Hence, because positive slopes 660 of the fiber is normally encountered, the maxiumum number of negative slopes 640 of the Fabry-resonances 620 are tuned to reciprocally relate to the positive slopes 660 of the optical fiber at the center ITU grid frequency of each ITU grid channel bandwidth.

Yet another way of tuning uses variations in the power level of an out-of-band saturating signal to shift the resonances and change the slope to the desired value as seen in curve B of FIG. 9.

In summary, a novel technique for simultaneously providing gain and dispersion compensation on a per-channel basis is taught. This lossless per-channel dispersion compensation is preferably accomplished with a semiconductor optical amplifier operated in reflection mode with a free-spectral-range (FSR) matched to the ITU grid, alone, in tandem, or with other dispersion compensating elements.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A circuit arrangement for dispersion compensation, comprising:
   an optical receiving path; and
   a Fabry-Perot semiconductor optical amplifier (SOA) coupled to the optical receiving path, the SOA having amplitudes and phases of Fabry-Perot resonances tunable by a direct current for providing a discontinuous and lossless per-channel dispersion compensation in the optical receiving path and amplifying the optical signals.

2. The circuit arrangement of claim 1 wherein the optical receiving path comprises:
   an input port for receiving an input optical signal having a plurality of channels at corresponding frequencies, each frequency having an amplitude and a channel bandwidth, the spacing between the plurality of frequencies conforming to an International Telecommunications Union grid (ITU grid); and
   an output port.

3. The circuit arrangement of claim 2 wherein the:
   Fabry-Perot semiconductor optical amplifier (SOA), operated in a reflection mode, is disposed between the input port and the output port for providing a Fabry-Perot cavity as defined by a pair of reflectors, the Fabry-Perot cavity tuned to have a phase transfer function for providing a periodic frequency response exhibiting a spectral periodicity defined as a free spectral range (FSR), the FSR matched to a multiple of the ITU grid in the plurality of frequencies and spacing, the multiple including one, wherein the Fabry-Perot SOA is tuned to apply a desired frequency-dependent time delay to each frequency of each wave in the packet of waves contained in the optical pulse entering the input port such that the group delay of pulses transmitted through the output port approximates a constant slope value, over the channel bandwidth, such that group delay dispersion of the optical pulse defined by the first derivative of the group delay equals the transmission fiber group-delay dispersion, thus reducing the system group delay dispersion to about zero, and wherein the semiconductor optical amplifier has a uniform amplitude transfer function to substantially preserve the amplitude of each frequency of the optical pulse transmitted to the output port.

4. The circuit arrangement of claim 3 further comprising:
   a circulator for providing a feedback path between the input port and the output port such that the Fabry-Perot SOA in reflection mode is disposed in the feedback path.

5. A method for group delay dispersion compensation, comprising the steps of:
   monitoring the group delay dispersion of an optical fiber transmission system near the center ITU grid frequency of at least one ITU grid channel; and
   discontinuously compensating for the individual group delay dispersion of the optical fiber transmission system near the center ITU grid frequency of at least one ITU grid channel, over the channel bandwidth;
   wherein the discontinuously compensating step comprises the steps of:
   tuning a semiconductor optical amplifier such that at least one dispersion characteristic of the Fabry-Perot resonances compensate for the group delay dispersion of the optical fiber transmission system at the center ITU grid frequency of at least one ITU grid channel bandwidth,
   while allowing the relative group delay between bits of the adjacent channels to the particular ITU channel to remain not corrected; wherein the tuning step comprises (or provides) simultaneous amplification of the optical signals, and
   inserting the semiconductor optical amplifier into an optical path of the optical fiber either before or after the tuning step.

6. The method of claim 5 wherein the step of tuning includes increasing the amplitude of the Fabry-Perot resonances by increasing a direct current into the semiconductor optical amplifier.

7. The method of claim 5 wherein the step of tuning includes shifting the resonance frequencies of the Fabry-Perot resonances by varying a cavity length of the semiconductor optical amplifier.

8. The method of claim 5 wherein the step of tuning includes changing the amplitude of the Fabry-Perot resonances by varying a direct current into the semiconductor optical amplifier and shifting the resonance frequencies of the Fabry-Perot resonances by varying a cavity optical length of the semiconductor optical amplifier such that the maximum number of negative slopes of the Fabry-resonances are reciprocally related to the positive slopes of the optical fiber at the center ITU grid frequency of each ITU grid channel bandwidth.

9. The method of claim 5 wherein the step of tuning includes changing the shape and slope of the group delay dependence on frequency by varying the power of an out-of-band saturating signal applied to the semiconductor optical amplifier to cause the semiconductor optical amplifier to operate in its saturation region such that the negative group delay dispersion of each channel is reciprocally related to the positive group delay dispersion of the optical fiber transmission system at the center ITU grid frequency of at least one ITU grid channel bandwidth.

10. An all-pass optical filter comprising:
    an input port for receiving an input optical pulse having a packet of waves at corresponding frequencies, each frequency having an amplitude and a channel bandwidth, the packet of waves having a plurality of frequencies and spacing between the plurality of frequencies conforming to an International Telecommunications Union grid (ITU grid),
    an output port; and
    at least one semiconductor optical amplifier disposed between the input port and the output port for providing a Fabry-Perot cavity as defined by a pair of reflectors, the Fabry-Perot cavity tuned to have a phase transfer function for providing a periodic frequency response exhibiting a spectral periodicity defined as a free spectral range (FSR), the FSR matched to a multiple of the ITU grid in the plurality of frequencies and spacing, the multiple including one, wherein the semiconductor optical amplifier is tuned to apply a desired frequency-dependent time delay to each frequency of each wave in the packet of waves contained in the optical pulse entering the input port such that the group delay dispersion of pulses transmitted through the output port approximates a constant value, over the channel bandwidth, so that net transmission system group delay dispersion of the optical pulse defined by the first derivative of the transmission system group delay to reduce to about zero, and wherein the semiconductor optical amplifier operating in a reflection mode has a uniform amplitude transfer function to substantially preserve the amplitude of each frequency of the optical pulse transmitted to the output port;

wherein the input port comprises:
  a circulator for providing a feedback path for the input optical pulse between the input port and the output port such that the at least one semiconductor optical amplifier is disposed in the feedback path; and
  a WDM coupler coupled to the circulator for adding an out-of-band saturation signal to the input optical pulse.

* * * * *